(12) United States Patent
Leng et al.

(10) Patent No.: US 8,194,365 B1
(45) Date of Patent: Jun. 5, 2012

(54) METHOD AND SYSTEM FOR PROVIDING A READ SENSOR HAVING A LOW MAGNETOSTRICTION FREE LAYER

(75) Inventors: Qunwen Leng, Palo Alto, CA (US); Chando Park, Palo Alto, CA (US); Yimin Guo, San Jose, CA (US); Christian Kaiser, San Jose, CA (US); Mahendra Pakala, Fremont, CA (US); Sining Mao, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 337 days.

(21) Appl. No.: 12/553,897

(22) Filed: Sep. 3, 2009

(51) Int. Cl.
*G11B 5/39* (2006.01)

(52) U.S. Cl. .................. 360/324.12; 360/324.2

(58) Field of Classification Search ............. 360/324.1, 360/324.11, 324.12, 324.2
See application file for complete search history.

(56) References Cited

U.S. PATENT DOCUMENTS

| | | | |
|---|---|---|---|
| 5,764,445 A | 6/1998 | Torng et al. | |
| 6,322,640 B1 | 11/2001 | Xiao et al. | |
| 6,347,049 B1 | 2/2002 | Childress et al. | |
| 6,413,325 B1 | 7/2002 | Shimazawa et al. | |
| 6,680,831 B2 | 1/2004 | Hiramoto et al. | |
| 6,690,163 B1 | 2/2004 | Hoshiya et al. | |
| 6,724,581 B2 | 4/2004 | Westwood | |
| 6,751,073 B2 | 6/2004 | Hasegawa | |
| 6,791,792 B2 | 9/2004 | Takahashi | |
| 6,819,532 B2 | 11/2004 | Kamijo | |
| 6,841,395 B2 | 1/2005 | Linn et al. | |
| 6,848,169 B2 | 2/2005 | Shin et al. | |
| 6,876,507 B2 | 4/2005 | Chen et al. | |
| 6,937,434 B2 | 8/2005 | Takahashi | |
| 7,077,929 B2 | 7/2006 | You et al. | |
| 7,160,572 B2 | 1/2007 | Fujikata et al. | |
| 7,211,340 B2 | 5/2007 | Nolan | |
| 7,230,264 B2 | 6/2007 | Thean et al. | |
| 7,230,265 B2 | 6/2007 | Kaiser et al. | |
| 7,241,631 B2 | 7/2007 | Huai et al. | |
| 7,256,971 B2 | 8/2007 | Horng et al. | |
| 7,270,896 B2 | 9/2007 | Parkin | |
| 7,349,187 B2 | 3/2008 | Parkin | |
| 7,351,483 B2 | 4/2008 | Parkin | |
| 7,423,849 B2 | 9/2008 | Gill | |
| 7,443,639 B2 | 10/2008 | Parkin | |
| 7,488,609 B1 | 2/2009 | Lin et al. | |
| 7,695,761 B1 | 4/2010 | Shen et al. | |
| 7,751,156 B2 | 7/2010 | Mauri et al. | |
| 7,800,868 B2 | 9/2010 | Gao et al. | |

(Continued)

OTHER PUBLICATIONS

Djayaprawira, et al., "230% room-temperature magnetoresistance in CoFeB/MgO/CoFeB magnetic tunnel junctions", Applied Physics Letters 86, 092502, 3 pages, 2005.

(Continued)

*Primary Examiner* — Jefferson Evans

(57) ABSTRACT

A method and system for providing a magnetic structure in magnetic transducer is described. The magnetic structure includes a pinned layer, a nonmagnetic spacer layer, and a free layer. The nonmagnetic spacer layer is between the pinned layer and the free layer. The free layer includes a first magnetic layer, a second magnetic layer, and a magnetic insertion layer between the first magnetic layer and the second magnetic layer. The first magnetic layer has a first magnetostriction. The second magnetic layer has a second magnetostriction opposite to the first magnetostriction. The magnetic insertion layer provides a growth texture barrier between the first magnetic layer and the second magnetic layer.

27 Claims, 4 Drawing Sheets

U.S. PATENT DOCUMENTS

| | | | |
|---|---|---|---|
| 7,929,259 | B2 | 4/2011 | Gao et al. |
| 2002/0009616 | A1 | 1/2002 | Kamiguchi et al. |
| 2003/0179071 | A1 | 9/2003 | Hiramoto et al. |
| 2004/0056288 | A1 | 3/2004 | Fukuzumi |
| 2004/0219772 | A1 | 11/2004 | You et al. |
| 2005/0009211 | A1 | 1/2005 | Linn et al. |
| 2005/0120544 | A1 | 6/2005 | Lam |
| 2005/0195534 | A1* | 9/2005 | Gill .................. 360/324.12 |
| 2006/0071287 | A1 | 4/2006 | Yuasa et al. |
| 2006/0093862 | A1 | 5/2006 | Parkin |
| 2006/0128038 | A1 | 6/2006 | Pakala et al. |
| 2006/0141640 | A1 | 6/2006 | Huai et al. |
| 2006/0180839 | A1 | 8/2006 | Fukumoto et al. |
| 2006/0209590 | A1 | 9/2006 | Guo et al. |
| 2007/0074317 | A1 | 3/2007 | Pakala et al. |
| 2007/0111332 | A1 | 5/2007 | Zhao et al. |
| 2007/0139827 | A1 | 6/2007 | Gao et al. |
| 2007/0188945 | A1 | 8/2007 | Fuji et al. |
| 2007/0228501 | A1 | 10/2007 | Nakamura et al. |
| 2007/0243639 | A1 | 10/2007 | Pietambaram et al. |
| 2008/0030907 | A1 | 2/2008 | Nakabayashi et al. |
| 2008/0062581 | A1 | 3/2008 | Parkin |
| 2008/0080101 | A1 | 4/2008 | Mauri et al. |
| 2008/0124454 | A1 | 5/2008 | Djayaprawira et al. |
| 2008/0174921 | A1 | 7/2008 | Ikarashi et al. |
| 2008/0179699 | A1 | 7/2008 | Horng et al. |
| 2008/0299679 | A1 | 12/2008 | Zhao et al. |
| 2009/0027810 | A1 | 1/2009 | Horng et al. |
| 2009/0027813 | A1 | 1/2009 | Carey et al. |
| 2010/0073827 | A1* | 3/2010 | Zhao et al. ............ 360/324.2 |
| 2010/0255349 | A1 | 10/2010 | Gao et al. |

OTHER PUBLICATIONS

Tsunekawa, et al., "Huge Magnetoresistance and Low Junction Resistance in Magnetic Tunnel Junctions with Crystalline MgO Barrier", IEEE Transactions on Magnetics, vol. 42, No. 2, pp. 103-107, Feb. 2006.

Park, et al., "Annealing effects on structural and transport properties of rf-sputtered CoFeB/MgO/CoFeB magnetic tunnel junctions", Journal of Applied Physics 99, 08A901, 3 pages, 2006.

Park, et al., "Effect of Adjacent Layers on Crystallization and Magnetoresistance in CoFeB/MgO/CoFeB Magnetic Tunnel Junction", IEEE Transactions on Magnetics, vol. 42, No. 10, pp. 2639-2641, Oct. 2006.

Tsunekawa, et al., "Giant tunneling magnetoresistance effect in low-resistance CoFeB/MgO(001)/CoFeB magnetic tunnel junctions for read-head applications", Applied Physics Letters 87, 072503, 3 pages, 2005.

Read, et al., "X-ray photoemission study of CoFeB/MgO thin film bilayers", Applied Physics Letters 90, 132503, 3 pages, 2007.

Neil Smith, "Fluctuation-dissipation considerations for phenomenological damping models for ferromagnetic thin film," Journal of Applied Physics, Oct. 1, 2002, vol. 92, No. 7, pp. 3877-3885.

Jian-Gang Zhu, "Magnetization Dynamics: Thermal Driven Noise in Magnetoresistive Sensors," Handbook of Magnetism and Advanced Magnetic Material, John Wiley & Sons, Ltd., 2007, 16 pages.

S.W. Sun, et al., "Possible giant surface magnetostriction in amorphous Co76Cr4B20", J. Appl. Phys. 69 (Abstract), Apr. 15, 1991, 5218.

* cited by examiner

METHOD AND SYSTEM FOR PROVIDING A READ SENSOR HAVING A LOW MAGNETOSTRICTION FREE LAYER

BACKGROUND

FIG. 1 depicts a portion of a conventional magnetic transducer 10, such as a conventional read transducer or other device. The conventional transducer 10 resides on a conventional substrate 11, such as an AlTec substrate. The conventional transducer 10 includes a conventional bottom shield 12, conventional shield 12, conventional antiferromagnetic (AFM) layer 18, conventional sensor 20, and conventional top shield 40. The transducer 10 also typically includes seed layer(s) (not shown) between the conventional AFM layer 14 and the conventional shield 12. The conventional shields 12 and 30 typically include NiFe and are formed by plating.

The conventional sensor 20 typically includes an antiferromagnetic layer 14, a pinned layer that is usually a synthetic antiferromagnetic (SAF) layer 22, a nonmagnetic layer 24, a free layer 30, and a capping layer 26. The conventional SAF layer 22 typically includes two ferromagnetic layers (not separately shown) separated by a nonmagnetic spacer layer (not shown). The ferromagnetic layers are generally antiferromagnetically coupled. The magnetization(s) of the conventional SAF layer 22 are pinned by the conventional AFM layer 14. More specifically, the first ferromagnetic layer adjoining the conventional AFM layer 14 has its magnetization pinned by the conventional AFM, for example via exchange interaction. The remaining ferromagnetic layer has its magnetization pinned because it is strongly magnetically coupled with the first ferromagnetic layer. The conventional nonmagnetic layer 24 may be a barrier layer or a conductive spacer layer. If a barrier layer 24 is used, then the sensor 20 is a tunneling magnetoresistive (TMR) sensor. If a conductive spacer layer 24 is used, then the sensor 20 is a spin valve or for current perpendicular to the plane giant magnetoresistance sensor.

The conventional free layer 30 includes a CoFe layer 32, a CoFeB layer 34, a conventional nonmagnetic Ta layer 36, and a conventional NiFe layer 38. The conventional free layer 30 has a thin CoFeB layer 34, which has high spin polarization. As deposited, the CoFeB layer 34 is amorphous. The second magnetic layer is a conventional NiFe layer 38. The conventional NiFe layer 38 typically has less than ten percent Fe and prefers an fcc crystal structure after annealing. The conventional free layer 30 also uses a conventional non-magnetic Ta layer 36 to separate the layers 34 and 38. This separation allows a higher high Q-factor, or high magnetoresistance at low RA.

Although the conventional transducer 10 and conventional sensor 20 may function, issues may arise in higher density magnetic recording applications. The areal storage density in a hard disk drive using the conventional transducer 10 increases dramatically every year. In order to maintain the magnetic properties of the transducer 10, the shield-to-shield distance, $h_1$, is desired to be decreased. This decrease may require thinner sensors 20. Further, a high ΔR/R (magnetoresistance) and low RA, or high Q factor, are desired. The conventional transducer 10 is also desired to be magnetically soft. In addition, low noise and a near zero magnetostriction is also desired. However, various features of the conventional sensor 20 and other conventional layers 14 and 26 contribute to a larger shield-to-shield spacing $h_1$, as well as other issues with the conventional sensor 20.

For example, the conventional free layer 30 is typically thick. The higher thickness is used to achieve higher magnetoresistance and lower magnetostriction for the conventional free layer 30. The conventional NiFe layer 38 of the conventional free layer 30 may have a higher damping constant and lower moment. The magnetic noise for the conventional transducer 10 is proportional to damping constant α and inversely proportional to saturated magnetization $M_s$ of the free layer 30. Thus, the NiFe layer 38 may contribute additional magnetic noise. The NiFe layer 38 may also be thicker to achieve the desired magnetostriction and higher total moment of the conventional free layer 30. Similarly, though functional, the conventional Ta layer 36 may cause a magnetic dead layer that may result in a higher damping constant. Further, all of the layers 32, 34, 36, and 38 contribute to the large thickness of the conventional free layer 30. Thus, a thicker conventional free layer 30 is used to obtain the desired performance, but increases the shield-to-shield spacing.

Other layers are also made thicker to achieve the desired performance. The reduction of the thickness of various layers, such as the conventional AFM layer 14 or conventional seed layers (not shown) may adversely affect performance of these layers. For example, reducing the thickness of the conventional AFM layer 14 may reduce its ability to pin the magnetizations of the conventional SAF 22. This may allow the magnetizations of the conventional SAF 22 to change direction, at least to a degree. Consequently performance of the conventional transducer 10 is adversely affected. Similarly, a reduction in the thicknesses of the conventional seed layers (not shown) may reduce the quality of the conventional AFM layer 14. As a result, the ability of the conventional AFM layer 14 to pin the magnetization of the conventional SAF 22 is again diminished. Consequently, performance of the conventional magnetic transducer 10 may again be adversely impacted by simply reducing the thickness of various layers.

Accordingly, what is needed is a system and method for providing a transducer that may be usable for higher density recording.

BRIEF SUMMARY OF THE INVENTION

A method and system for providing a magnetic structure in magnetic transducer is described. The magnetic structure includes a pinned layer, a nonmagnetic spacer layer, and a free layer. The nonmagnetic spacer layer is between the pinned layer and the free layer. The free layer includes a first magnetic layer, a second magnetic layer, and a magnetic insertion layer between the first magnetic layer and the second magnetic layer. The first magnetic layer has a first magnetostriction. The second magnetic layer has a second magnetostriction opposite to the first magnetostriction. The magnetic insertion layer provides a growth texture barrier between the first magnetic layer and the second magnetic layer.

DETAILED DESCRIPTION OF THE PREFERRED EMBODIMENTS

Figure 1:
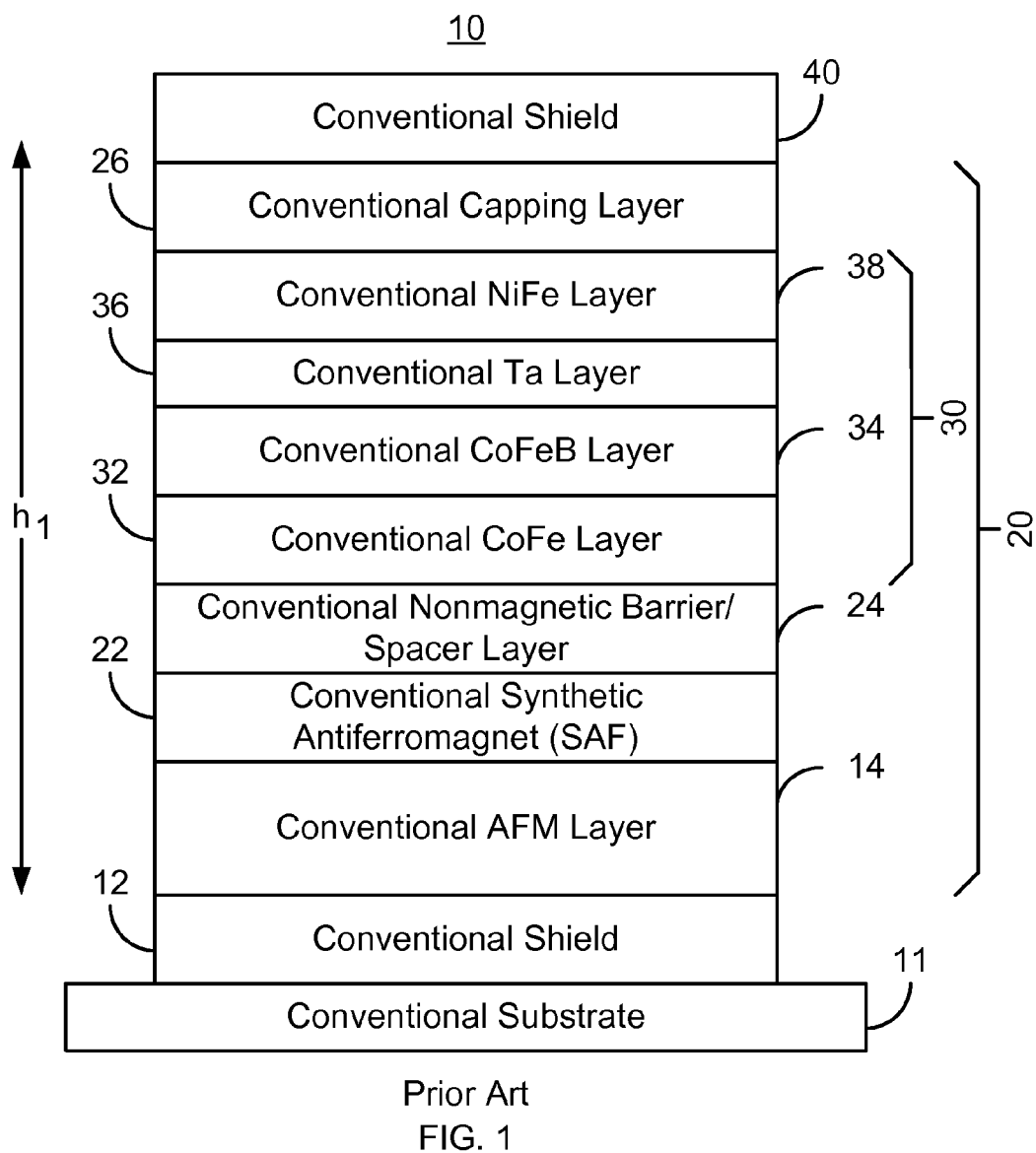
FIG. 1 is a diagram of a portion of a conventional transducer including a conventional sensor.
Figure 2:
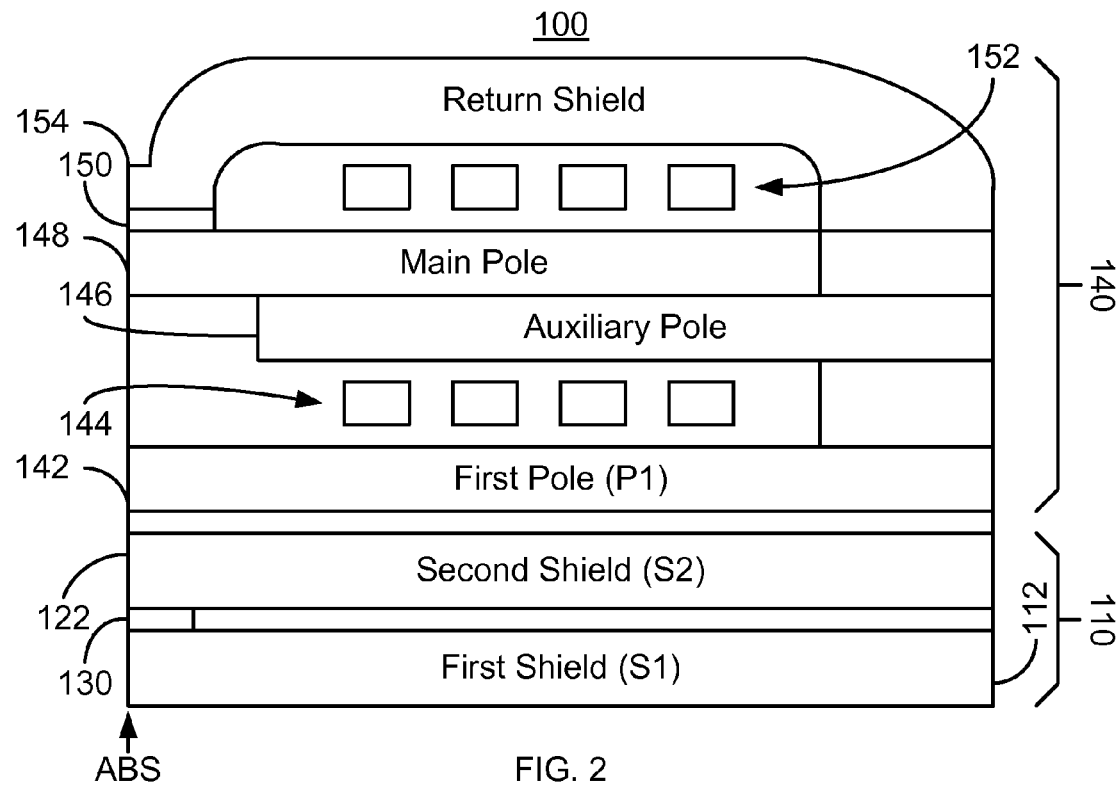
FIG. 2 depicts an exemplary embodiment of a head having a transducer including an exemplary embodiment of a magnetic structure.
Figure 3:
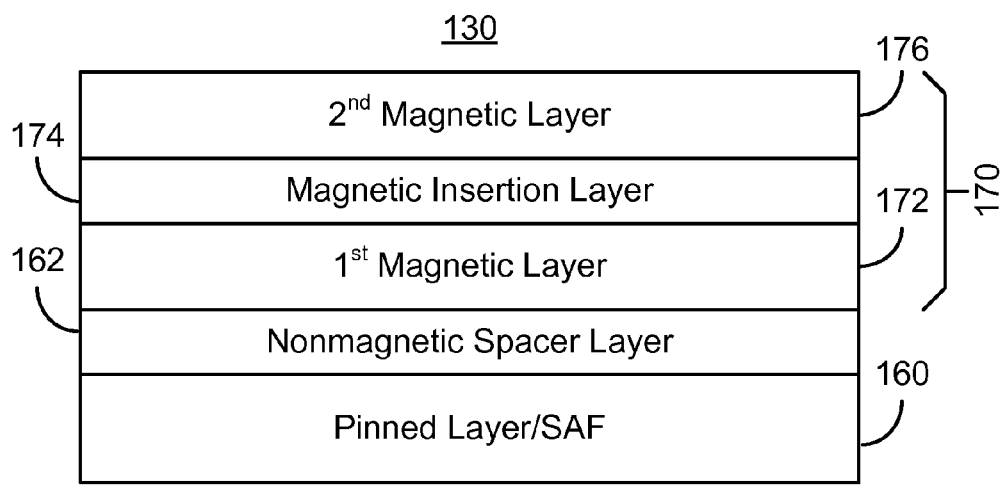
FIG. 3 depicts an exemplary embodiment of a portion of transducer including an exemplary embodiment of a magnetic structure.

FIG. 2 depicts a magnetic head 100. The magnetic head includes a magnetic read transducer 110 and write transducer 140. FIG. 3 depicts an exemplary embodiment of a magnetic structure 130 that may be used as the read sensor of the magnetic head 100. However, in other embodiments, the magnetic structure 130 may be used for other purposes. Further, the magnetic structure 130 is shown in a current-perpendicular-to-plane (CPP) configuration, and thus is attached to the shields 112 and 122. However, in another embodiment, a gap may exist between the magnetic structure 130 and the shields 112 and/or 122. Referring to FIGS. 2-3, in another embodiment, the head 100 might include only the read transducer 110. The head 100 may reside on a slider (not shown) of a disk drive (not shown). The head 100 is also described in the context of particular layers. However, in some embodiments, such layers may include sub-layer(s). For clarity, FIGS. 2-3 are not drawn to scale.

The write transducer 140 includes a first pole 142, auxiliary pole 146, main pole 148, write gap 150, coils 144 and 152, and return shield 154. However, in another embodiment, the write transducer 140 other and/or different components. In addition, one or more portions of the write transducer 140 might be omitted in various embodiments.

The read transducer 110 includes shields 112 and 122 and read sensor/magnetic structure 130. In addition, although only one magnetic structure 130 is shown, multiple magnetic structures may be present. In addition, although used as a read sensor in the transducer 100, the magnetic structure 130 might be used for other purposes in another transducer. In addition, as shown expressly in FIG. 3, the magnetic structure 130 includes a pinned layer 160, a nonmagnetic spacer layer 162, and a free layer 170. In some embodiments, other components may be included as part of the magnetic structure 130. For example, the magnetic structure 130 might also include pinning layers, such as an AFM layer, barrier layer(s), seed layer(s) and/or capping layers. The pinned layer 160 has its magnetization fixed, or pinned in place. For example, the magnetization of the pinned layer 160 may be exchange coupled to an AFM layer (not shown). In other embodiments, pinning may be achieved in another manner. In some embodiments, the pinned layer 160 is a SAF including two or more ferromagnetic layers interleaved with nonmagnetic layer(s). The ferromagnetic layers may be antiferromagnetically coupled, for example due to their spacing as determined by the nonmagnetic layer(s). The first ferromagnetic layer adjoining the pinning layer (not shown) has its magnetization pinned by the pinning layer, for example via exchange interaction. The remaining ferromagnetic layer(s) have their magnetization pinned because they are strongly magnetically coupled. The nonmagnetic spacer layer 162 may be conductive or an insulating tunneling barrier layer. For example, in one embodiment, the nonmagnetic spacer layer 162 may be a crystalline tunneling barrier layer. In some such embodiments, the crystalline tunneling barrier may include or be composed of crystalline MgO. In other embodiments, the nonmagnetic spacer layer may have other structures.

The free layer 170 includes multiple layers. In the embodiment shown in FIG. 3, the free layer 170 includes a first magnetic layer 172, a magnetic insertion layer 174, and a second magnetic layer 176. In some embodiments, the free layer 170 may include other layers. The first magnetic layer 172 has a first magnetostriction. The first magnetic layer 172 may also have a high spin polarization and a high magnetic moment. For example, the first magnetic layer 172 may include CoFeB. Thus, in some embodiments, the first magnetic layer 172 may be $(Co_{1-\alpha}Fe_\alpha)_{1-\beta}B_\beta$, where $\alpha$ is at least ten and not more than sixty percent, and $\beta$ is at least ten and not more than thirty percent. In some embodiments, the thickness of the first magnetic layer 172 may be at least ten and not more than thirty Angstroms.

The second magnetic layer 176 has a second magnetostriction opposite to the first magnetostriction. For example, the first magnetic layer 172 may have a high positive magnetostriction. In such an embodiment, the second magnetic layer 176 has a negative magnetostriction. In another embodiment, the first magnetic layer 172 may have a negative magnetostriction. In such an embodiment, the second magnetic layer 176 has a positive magnetostriction. Thus, in either embodiment, the total magnetostriction of the free layer 170 may be near zero. For example, in some embodiments, the free layer 170 may have a total magnetostriction of less than $2\times10^{-6}$ and greater than $-2\times10^{-6}$. In some such embodiments, the free layer 170 has a low damping constant. For example, the free layer 170 may have a total damping constant less 0.015. In some embodiments, the second magnetic layer 176 includes at least one of NiFe and CoB. The NiFe layer may, for example, include not more than ten percent (including zero) Fe. In another embodiment, $Co_{1-z}B_z$, $(Co_{1-\gamma}Ni_\gamma)_{1-z}B_z$, $(Co_{1-\gamma}Nb_\gamma)_{1-z}B_z$, where $\gamma$ is not more than ten percent (and may be zero) and z is between zero and 100 percent. In some such embodiments, z is at least twenty-five and not more than seventy-five percent. Further, similar alloys of Co with B may also be used. In some embodiments, the second magnetic layer 176 has a thickness of at least ten and not more than sixty Angstroms.

The magnetic insertion layer 174 resides between the magnetic layers 172 and 176 and provides a growth texture barrier between the magnetic layers 172 and 176. The first magnetic layer 172 may thus have a first crystal structure. The second magnetic layer 176 may have a second crystal structure different from the first crystal structure. Thus, the presence of the second magnetic layer 176 may improve the magnetostriction of the free layer 170 without adversely affecting the crystal structure of the underlying magnetic layer 172. For example, CoFeB that is amorphous as deposited and that prefers a bcc crystal structure after annealing may be used as the first magnetic layer 172 and NiFe (for example less than ten percent Fe) may be used for the second magnetic layer 176. Although the second magnetic layer 176 would then prefer an fcc crystal structure after annealing, use of the magnetic insertion layer 174 may reduce the impact of or prevent the fcc crystal structure of the second magnetic layer 176 from adversely affecting the crystal structure of the underlying CoFeB layer 172. In some embodiments, the magnetic insertion layer 174 includes Fe and/or Co. For example, an Fe layer or a Co layer may be used for the magnetic insertion layer 174. In other embodiments, the magnetic insertion layer 174 may include at least one of a Co alloy and a Fe alloy. For example, materials such as one or more of Co, Fe, $Co_{1-\gamma}Fe_\gamma$, $Fe_{1-\gamma}Ta_\gamma$, and $Fe_{1-\gamma}Hf_\gamma$, where $\gamma$ is at least zero and not more than ten percent, might be used for the magnetic insertion layer 174. Thus, the magnetic insertion layer 174 may also have a low magnetostriction, low damping constant, and/or higher magnetic moment. The magnetic insertion layer 174 is also desired to be thin. For example, in some embodiments, the magnetic insertion layer 174 has a thickness of at least one and not more than five Angstroms.

Use of the magnetic structure 130 including the free layer 170 may improve the performance of the transducer 110. The magnetic insertion layer 174 allows the entire free layer 170 to be magnetic. Further, the magnetic coupling between the layers 172 and 176 may be improved. Magnetic dead zones in the layers 172 and 176 may also be reduced or eliminated. The first magnetic layer 172 may have a high spin polarization, which may improve magnetoresistance of the magnetic structure 130. More specifically, a high magnetoresistance and low RA of less than or equal to one ohm-micrometer-squared, or high Q factor, may be achieved in some embodiments. Use of the second magnetic layer 176 may reduce the magnitude of the total magnetostriction of the free layer 170. For example, in some embodiments, the free layer may have a near zero (absolute value of less than or equal to $2 \times 10^{-6}$) magnetostriction. The free layer 170 may also be soft, for example having a coercivity of less than six Oersted. In addition, the free layer 170 may have a relatively low damping constant, and thus low magnetic noise. Further, the shield-to-shield spacing may be reduced. In some of the embodiments described above, the thickness of the free layer 170 may be as low as twenty-one Angstroms and not more than ninety-five Angstroms. Thus, a thinner free layer 170 may be achieved substantially without adversely affecting the magnetic performance of the structure 130. Consequently, the shield-to-shield spacing may be reduced while maintaining or improving the performance of the magnetic structure 130. Consequently, the transducer 100 may be more appropriate for use at higher recording densities.

Figure 4:
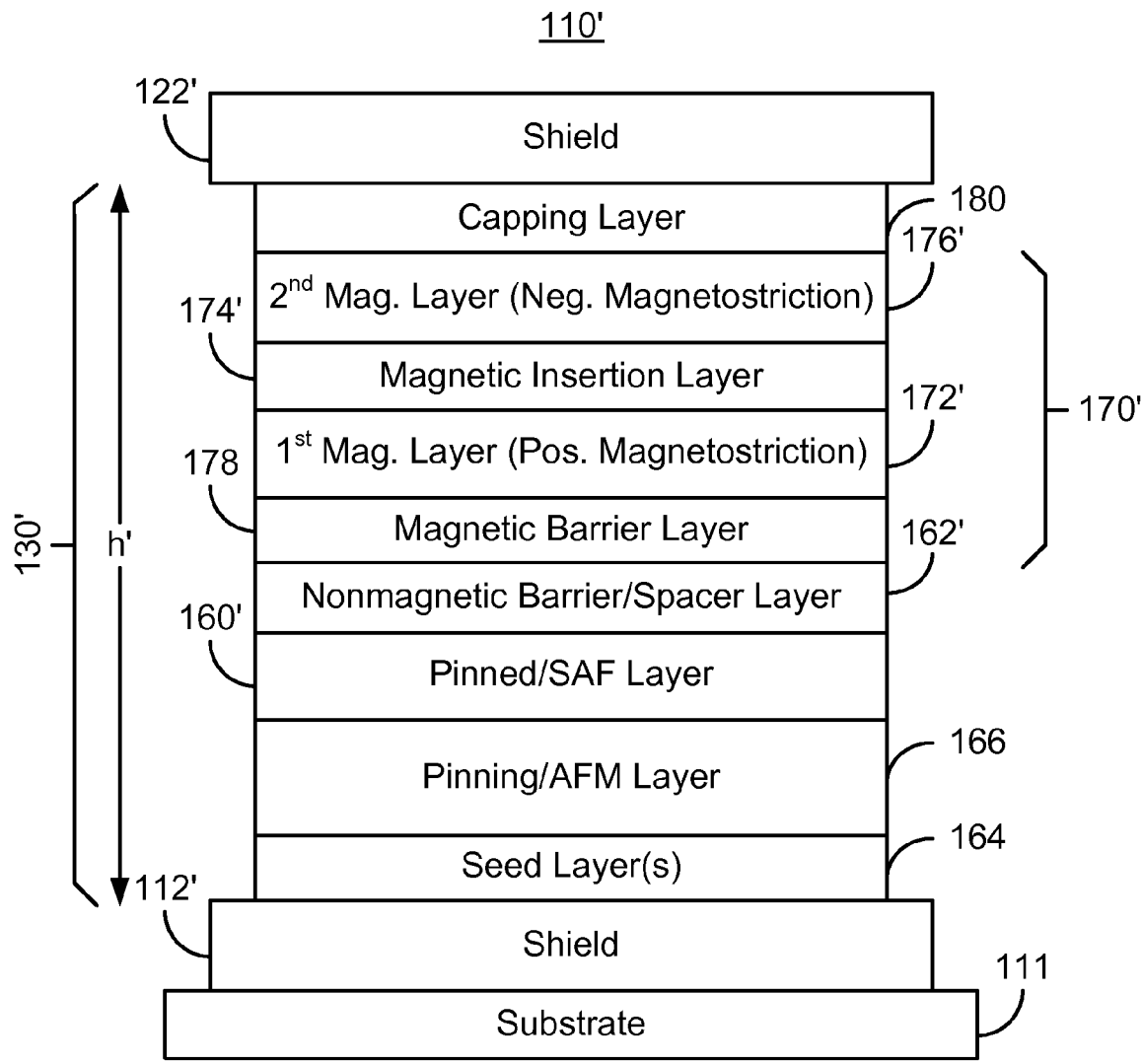
FIG. 4 depicts another exemplary embodiment of a portion of transducer including an exemplary embodiment of a magnetic structure.

FIG. 4 depicts another exemplary embodiment of a portion of transducer 110' including an exemplary embodiment of a free layer 170'. The transducer 110' may be analogous to the transducer 110. Consequently, analogous portions of the transducer 100' are labeled in a similar manner to the components of the transducer 110. Further, the transducer 110' may be part of a merged head that may also include a write transducer, such as the transducer 140, reside on a slider (not shown) of a disk drive (not shown). The transducer 110' is described in the context of particular layers. However, in some embodiments, such layers may include sub-layer(s). For clarity, FIG. 4 is not drawn to scale. In addition, although only one magnetic structure 130' is shown, multiple magnetic structures may be present. Further, the magnetic structure 130' is shown in a CPP configuration and attached to the shields 112' and 122'. However, in another embodiment, a gap may exist between the magnetic structure 130' and the shields 112' and/or 122'.

The read transducer 110' includes shields 112' and 122' and read sensor/magnetic structure 130'. In the embodiment shown, the magnetic structure 130' is a read sensor. The magnetic structure 130' includes a pinned layer 160', a nonmagnetic spacer layer 162', and a free layer 170' that are analogous to the pinned layer 160, the nonmagnetic spacer layer 162, and the free layer 170, respectively. The magnetic structure 130' also includes a pinning layer 166, seed layer(s) 164 and/or capping layers 180. The pinning layer 166 may be an AFM layer which pins the magnetization of at least a portion of the pinned layer 160', for example via an exchange coupling. The seed layer(s) 164 may be magnetic or nonmagnetic. In some embodiments the seed layer(s) 164 are used to provide a desired surface for growth of the pinning layer 166. Note that if the seed layer(s) are magnetic, the shield-to-shield spacing h' may be reduced by the thickness of the seed layer(s). The capping layer 180 may be used to protect the underlying portions of the magnetic structure 130'. In some embodiments, the capping layer 180 may include one or more of Ta, Ru, Hf, NiFeHf, NiFeTa, CoRuB and similar materials.

The pinned layer 160' is analogous to the pinned layer 160 depicted in FIG. 3. Thus, the pinned layer 160' has its magnetization fixed, or pinned in place. For example by the pinning layer 166. In some embodiments, the pinned layer 160' is a SAF including two or more ferromagnetic layers interleaved with nonmagnetic layer(s). The ferromagnetic layers may be antiferromagnetically coupled, for example due to their spacing as determined by the nonmagnetic layer(s). The nonmagnetic spacer layer 162' may be conductive or an insulating tunneling barrier layer. For example, in one embodiment, the nonmagnetic spacer layer 162' may be a crystalline tunneling barrier layer. In some such embodiments, the crystalline tunneling barrier may include or be composed of crystalline MgO. In other embodiments, the nonmagnetic spacer layer 162' may have other structures.

The free layer 170' includes multiple layers. In the embodiment shown in FIG. 4, the free layer 170 includes a magnetic barrier layer 178, a first magnetic layer 172', a magnetic insertion layer 174', and a second magnetic layer 176'. In some embodiments, the free layer 170 may include other layers.

The magnetic barrier layer 178 may be used to prevent interdiffusion between the free layer 170 and other layers, such as the nonmagnetic spacer layer 162'. In some embodiments, the magnetic barrier layer 178 may include a layer of CoFe. For example, in some embodiments $Co_{1-x}Fe_x$, where x is at least ten percent. In addition, the magnetic barrier layer 178 may be thin. In one embodiment, the magnetic barrier layer 178 is between zero (i.e. nonexistent) and fifteen Angstroms thick.

The first magnetic layer 172' is analogous to the first magnetic layer 172. Thus, the first magnetic layer 172' may have analogous properties, have the same thickness range, and be formed from the same materials as described above. For example, the first magnetic layer 172' has a first magnetostriction and may have high spin polarization and magnetic moment.

The second magnetic layer 176' is analogous to the second magnetic layer 176. Thus, the second magnetic layer 176' may have analogous properties, have the same thickness range, and be formed from the same materials as described above. For example, the second magnetic layer 176' has a second magnetostriction opposite to the first magnetostriction.

The magnetic insertion layer 174' resides between the magnetic layers 172' and 176' and provides a growth texture barrier between the magnetic layers 172' and 174'. Thus, the magnetic insertion layer 174' is analogous to the magnetic insertion layer 174. The magnetic insertion layer 174' may thus have analogous properties, be made of the same materials, and have the same thickness range. For example, the use of the magnetic insertion layer 174' may allow the first magnetic layer 172' to have a first crystal structure and the second magnetic layer 176' to have a second crystal structure different from the first crystal structure. In some embodiments, the magnetic insertion layer 174' has a low magnetostriction and a low damping constant, such as in the materials described above.

The magnetic structure 130' has analogous benefits to the magnetic structure 130. Use of the magnetic structure 130' including the free layer 170' may improve the performance of the transducer 100. Thus, the free layer 170' may have low magnetostriction, high magnetoresistance, low RA low magnetic noise, and be magnetically soft, as described above for the magnetic structure 130. Further, the presence of the magnetic barrier layer 178 reduces diffusion of materials between the free layer 170' and the nonmagnetic spacer layer 162'.

Thus, a thinner free layer 170' may be achieved substantially without adversely affecting the magnetic performance of the structure 130'. In some embodiments, a shield-to-shield spacing as low as eighteen nanometers may be achieved. In other embodiments, other low shield-to-shield spacings may be attained. Consequently, the shield-to-shield spacing may be reduced while maintaining or improving the performance of the magnetic structure 130'. Consequently, the transducer 110' may be more appropriate for use at higher recording densities.

Figure 5:
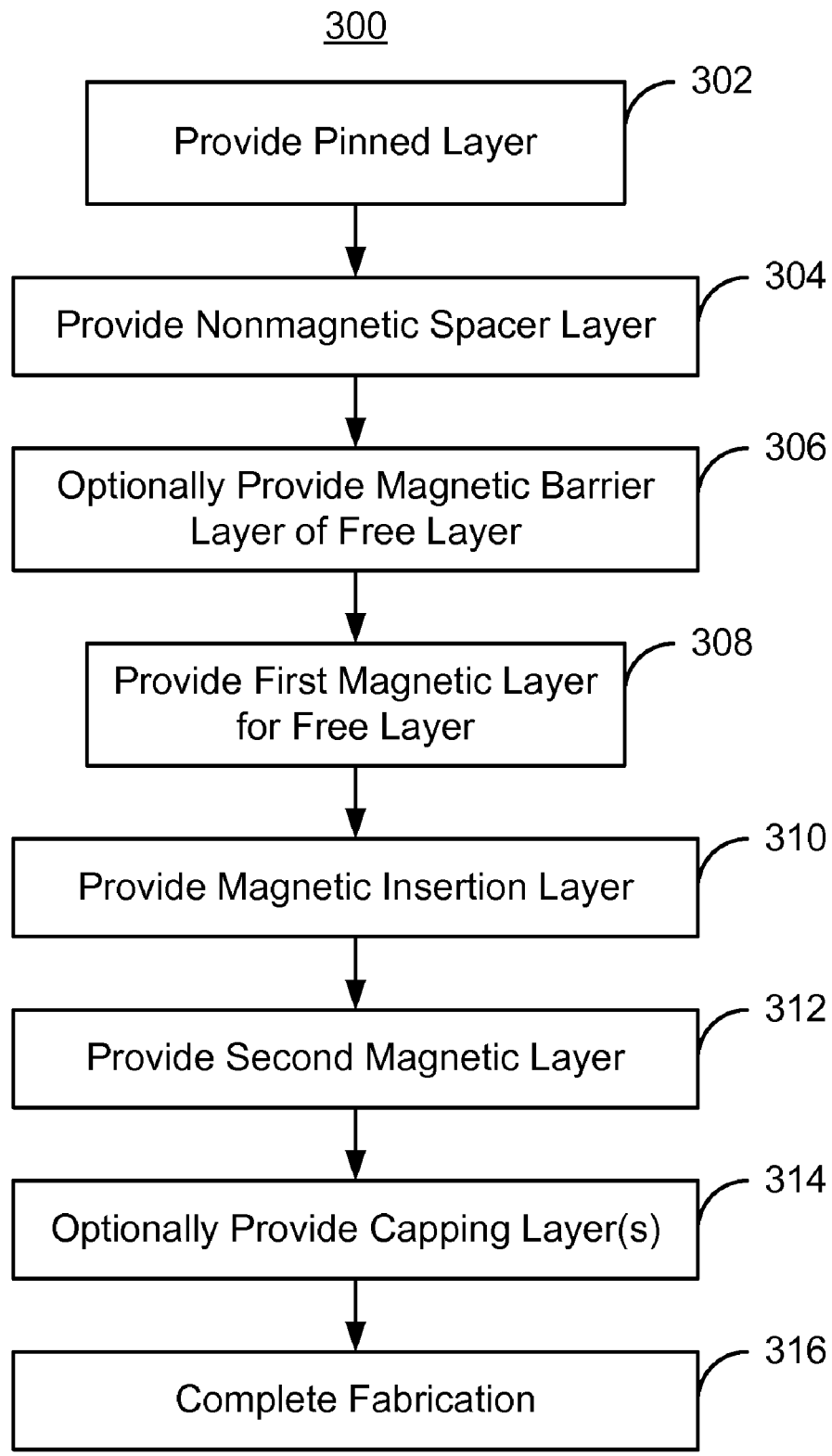
FIG. 5 depicts an exemplary embodiment of a method of forming a portion of transducer including an exemplary embodiment of a magnetic structure.

FIG. 5 is a flow chart of an exemplary embodiment of a method 300 for fabricating a transducer. For simplicity, some steps may be omitted. The method 300 is described in the context of the transducer 110. However, the method 300 may be used for other transducers (not shown). The method 300 also may commence after formation of other structures of the read and/or write transducer. The method 300 is also described in the context of providing a single magnetic structure 130/130'. However, the method 300 may be used to fabricate multiple structures at substantially the same time. The method 300 and structures such as the transducer 110/110' are also described in the context of particular layers. However, in some embodiments, such layers may include sub-layer(s). The method 300 commences after the pinning layer 166 is provided.

The pinned layer 160/160' is provided on the pinning layer 166, via step 302. The nonmagnetic spacer layer 162/162' is provided on the pinned layer 160/160', via step 304. The free layer 170/170' is provided in steps 306-312. Thus, the magnetic barrier layer 178 may optionally be provided in step 306. Step 306 thus includes depositing the desired materials, such as CoFe. The first magnetic layer 172/172' is provided, via step 308. The magnetic insertion layer 174/174' is provided, via step 310. The second magnetic layer 176/176' is provided, via step 312. In addition, a capping layer 180 may be provided in step 314. Fabrication of the transducer 110/110' may be completed, via step 316. Step 316 may include performing an anneal, for example in a magnetic field having the desired orientation. In addition, other structures such as shields may be fabricated. Thus, using the method 300, the benefits of the transducers 110 and 110' may be achieved.

We claim:

1. A magnetic structure in a magnetic recording transducer comprising:
   a pinned layer;
   a nonmagnetic spacer layer; and
   a free layer, the nonmagnetic spacer layer residing between the pinned layer and the free layer, the free layer including a first magnetic layer, a second magnetic layer, a magnetic insertion layer and a magnetic barrier layer, the magnetic insertion layer being between the first magnetic layer and the second magnetic layer, the magnetic barrier layer between the first magnetic layer and the nonmagnetic spacer layer, the first magnetic layer having a first magnetostriction, the second magnetic layer having a second magnetostriction, the second magnetostriction being opposite to the first magnetostriction, the magnetic insertion layer providing a growth texture barrier between the first magnetic layer and the second magnetic layer.

2. The magnetic structure of claim 1 wherein the first magnetostriction is positive and the second magnetostriction is negative.

3. The magnetic structure of claim 1 wherein the first magnetic layer includes a CoFeB and the second magnetic layer includes at least one of NiFe and CoB.

4. The magnetic structure of claim 1 wherein the magnetic insertion layer further includes at least one of Fe and Co.

5. The magnetic structure of claim 4 wherein the magnetic insertion layer includes at least one of a Co alloy and a Fe alloy.

6. The magnetic structure of claim 5 wherein the magnetic insertion layer further includes at least one of Fe, CoFe, FeTa, FeHf, and Co.

7. The magnetic structure of claim 1 wherein the magnetic insertion layer has a thickness of at least one and not more than five Angstroms.

8. The magnetic structure of claim 1 wherein the magnetic insertion layer has a low magnetostriction and a low damping constant.

9. The magnetic structure of claim 1 wherein the free layer has a total magnetostriction of less than $2 \times 10^{-6}$ and greater than $-2 \times 10^{-6}$ and wherein the free layer has a total damping constant less 0.015.

10. The magnetic structure of claim 1 wherein the pinned layer is a synthetic antiferromagnet.

11. The magnetic structure of claim 1 wherein nonmagnetic spacer layer includes a crystalline tunneling barrier layer.

12. The magnetic structure of claim 11 wherein the crystalline tunneling barrier layer includes MgO.

13. The magnetic structure of claim 1 wherein the nonmagnetic spacer layer is conductive.

14. The magnetic structure of claim 1 wherein the first magnetic layer is between the nonmagnetic spacer layer and the magnetic insertion layer.

15. A magnetic structure in a magnetic recording transducer comprising:
    a pinned layer;
    a nonmagnetic spacer layer; and
    a free layer, the nonmagnetic spacer layer residing between the pinned layer and the free layer, the free layer including a first magnetic layer, a second magnetic layer, and a magnetic insertion layer between the first magnetic layer and the second magnetic layer, the first magnetic layer having a first magnetostriction, the second magnetic layer having a second magnetostriction, the second magnetostriction being opposite to the first magnetostriction, the magnetic insertion layer providing a growth texture barrier between the first magnetic layer and the second magnetic layer, the first magnetic layer having a first crystal structure and the second magnetic layer having a second crystal structure, and wherein the free layer further includes a magnetic barrier layer between the first magnetic layer and the nonmagnetic spacer layer.

16. A magnetic structure in a magnetic recording transducer comprising:
    a pinning layer;
    a pinned layer adjacent to the pinning layer, the pinned layer being a synthetic antiferromagnet;
    a crystalline tunneling barrier layer; and
    a free layer, the crystalline tunneling barrier layer residing between the pinned layer and the free layer, the free layer including a magnetic barrier layer, a CoFeB layer, a magnetic insertion layer, and a top magnetic layer, the magnetic barrier layer being between the crystalline tunneling barrier layer and the CoFeB layer, the CoFeB layer residing between the magnetic barrier layer and the magnetic insertion layer, the magnetic insertion layer being between the CoFeB layer and the top magnetic layer, the magnetic insertion layer including at least one of Fe, Co, CoFe, FeTa, and FeHf, the top magnetic layer including at least one of NiFe and CoB; and
    a capping layer on the free layer.

17. A disk drive comprising:
    magnetic structure in a magnetic recording transducer comprising:
    a slider; and
    a magnetic recording transducer coupled with the slider and including a magnetic structure, the magnetic structure including a pinned layer, a nonmagnetic spacer layer, and a free layer, the nonmagnetic spacer layer residing between the pinned layer and the free layer, the free layer including a first magnetic layer, a second magnetic layer, a magnetic insertion layer, and a magnetic barrier layer, the magnetic insertion layer being between the first magnetic layer and the second magnetic layer, the magnetic barrier layer being between the first magnetic layer and the nonmagnetic spacer layer, the first magnetic layer having a first magnetostriction, the second magnetic layer having a second magnetostriction, the second magnetostriction being opposite to the first magnetostriction, the magnetic insertion layer providing a growth texture barrier between the first magnetic layer and the second magnetic layer.

18. A method for providing a magnetic structure in a magnetic recording transducer comprising:
    providing a pinned layer;
    providing a nonmagnetic spacer layer; and
    providing a free layer, the nonmagnetic spacer layer residing between the pinned layer and the free layer, the free layer including a first magnetic layer, a second magnetic layer, a magnetic insertion layer, and a magnetic barrier layer, the magnetic insertion layer being between the first magnetic layer and the second magnetic layer, the magnetic barrier layer being between the first magnetic layer and the nonmagnetic spacer layer, the first magnetic layer having a first magnetostriction, the second magnetic layer having a second magnetostriction, the second magnetostriction being opposite to the first magnetostriction, the magnetic insertion layer providing a growth texture barrier between the first magnetic layer and the second magnetic layer.

19. The method of claim 18 wherein the first magnetostriction is positive and the second magnetostriction is negative.

20. The method of claim 18 wherein the first magnetic layer includes a CoFeB and the second magnetic layer includes at least one of NiFe and CoB.

21. The method of claim 18 wherein the magnetic insertion layer further includes at least one of Fe and Co.

22. The method of claim 21 wherein the magnetic insertion layer includes at least one of a Co alloy and a Fe alloy.

23. The method of claim 22 wherein the magnetic insertion layer further includes at least one of Fe, CoFe, FeTa, FeHf, and Co.

24. The method of claim 18 wherein the magnetic insertion layer has a thickness of at least one and not more than five Angstroms.

25. The method of claim 18 wherein the step of providing the pinned layer further includes:
    providing a synthetic antiferromagnet.

26. The method of claim 18 wherein the step of providing the nonmagnetic spacer layer further includes:
    providing a crystalline tunneling barrier layer.

27. The method of claim 18 wherein the step of providing the nonmagnetic spacer layer further includes:
    providing a conductive layer.

* * * * *